(12) United States Patent
Chang

(10) Patent No.: US 7,910,908 B2
(45) Date of Patent: Mar. 22, 2011

(54) PHASE CHANGE MEMORY DEVICE IN WHICH A PHASE CHANGE LAYER IS STABLY FORMED AND PREVENTED FROM LIFTING AND METHOD FOR MANUFACTURING THE SAME

(75) Inventor: Heon Yong Chang, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 413 days.

(21) Appl. No.: 11/855,235

(22) Filed: Sep. 14, 2007

(65) Prior Publication Data

US 2008/0116445 A1   May 22, 2008

(30) Foreign Application Priority Data

Nov. 16, 2006   (KR) .................. 10-2006-0113470

(51) Int. Cl.
*H01L 45/00* (2006.01)
(52) U.S. Cl. ............... 257/4; 257/E45.001; 365/163
(58) Field of Classification Search ........ 257/2–4, 257/E45.002, E27.004; 365/163
See application file for complete search history.

(56) References Cited

U.S. PATENT DOCUMENTS

| 2004/0164290 | A1* | 8/2004 | Yi et al. ...................... 257/4 |
| 2004/0251551 | A1* | 12/2004 | Hideki .................... 257/758 |
| 2007/0069249 | A1* | 3/2007 | Hayakawa ............... 257/246 |
| 2007/0187801 | A1* | 8/2007 | Asao et al. ............... 257/613 |
| 2007/0292985 | A1* | 12/2007 | Zhang ....................... 438/95 |

FOREIGN PATENT DOCUMENTS

| JP | 2005-032855 A | 2/2005 |
| KR | 1020030081900 A | 10/2003 |
| KR | 1020040047272 A | 6/2004 |
| KR | 10-0713809 B1 | 4/2007 |

* cited by examiner

*Primary Examiner* — Colleen A Matthews
(74) *Attorney, Agent, or Firm* — Ladas & Parry LLP

(57) ABSTRACT

A phase change memory device includes a semiconductor substrate having a plurality of phase change cell regions; a lower electrode formed in each of the phase change cell regions on the semiconductor substrate; an insulation layer formed on the semiconductor substrate to cover the lower electrode and defined with a contact hole which exposes the lower electrode; a heater formed in the contact hole; a conductive pattern formed on the insulation layer to be spaced apart from the heater; a phase change layer formed on the heater, the conductive pattern, and portions of the insulation layer between the heater and the conductive pattern; and an upper electrode formed on the phase change layer. This phase change memory device allows the phase change layer to be stably formed and prevents the phase change layer from lifting.

7 Claims, 7 Drawing Sheets

PHASE CHANGE MEMORY DEVICE IN WHICH A PHASE CHANGE LAYER IS STABLY FORMED AND PREVENTED FROM LIFTING AND METHOD FOR MANUFACTURING THE SAME

CROSS-REFERENCE TO RELATED APPLICATIONS

The present application claims priority to Korean patent application number 10-2006-0113470 filed on Nov. 16, 2006, which is incorporated herein by reference in its entirety.

BACKGROUND OF THE INVENTION

The present invention relates to a phase change memory device and a method for manufacturing the same, and more particularly, to a phase change memory device in which a phase change layer is stably formed and is prevented from lifting, and a method for manufacturing the same.

In general, memory devices are largely divided into a volatile RAM (random access memory), which loses inputted information when power is interrupted, and a non-volatile ROM (read-only memory), which can continuously maintain the stored state of inputted information even when power is interrupted. When considering volatile RAM, a DRAM (dynamic RAM) and an SRAM (static RAM) can be mentioned, and when considering non-volatile ROM, a flash memory device such as an EEPROM (electrically erasable and programmable ROM) can be mentioned.

As is well known in the art, while the DRAM is an excellent memory device, the DRAM must have high charge storing capacity, and to this end, since the surface area of an electrode must be increased, it is difficult to accomplish a high level of integration. Further, in the flash memory device, due to the fact that two gates are stacked on each other, a high operation voltage is required when compared to a source voltage. Accordingly, a separate booster circuit is needed to form the voltage necessary for write and delete operations, making it difficult to accomplish a high level of integration.

To improve upon the current memory devices, researches have been actively making an effort to develop a novel memory device that has a simple configuration and is capable of accomplishing a high level of integration while retaining the characteristics of the non-volatile memory device. A phase change memory device recently disclosed in the art is a product of this effort.

In the phase change memory device, a phase change, which occurs in a phase change layer interposed between a lower electrode and an upper electrode, from a crystalline state to an amorphous state is due to current flow between the lower electrode and the upper electrode. The information stored in a cell is recognized by the medium of a difference in resistance between the crystalline state and the amorphous state. In detail, in the phase change memory device, a chalcogenide layer, being a compound layer made of germanium (Ge), stibium (Sb), and tellurium (Te), is employed as a phase change layer. As a current is applied, the phase change layer undergoes a phase change by heat, that is, Joule heat, between the amorphous state and the crystalline state. Accordingly, in the phase change memory device, when considering the fact that the specific resistance of the phase change layer in the amorphous state is higher than the specific resistance of the phase change layer in the crystalline state, in a read mode, whether the information stored in a phase change cell has a logic value of '1' or '0' is determined by sensing the current flowing through the phase change layer.

It is known that, since the phase change memory device has a simple structure, and adjoining cells do not interfere with each other, a high level of integration is possible. Also, since the phase change memory device has a read speed of several tens of ns (nano second) and a relatively high write speed of several tens to several hundreds ns, high speed operation is possible.

Additionally, because the phase change memory device has excellent applicability to the conventional CMOS logic processes allowing manufacturing costs to be reduced, the phase change memory device is regarded as a memory device that is highly advantageous in terms of commercialization.

However, when considering phase change memory devices of the prior art, in the course of depositing a phase change material, that is, in the course of depositing a phase change material layer on an insulation layer, the phase change material layer is likely to be poorly deposited on the insulation layer, and even if the phase change material layer is deposited, when conducting subsequent processes lifting of a phase change layer is likely to occur.

SUMMARY OF THE INVENTION

An embodiment of the present invention is directed to a phase change memory device in which a phase change layer is stably formed and is prevented from lifting, and a method for manufacturing the same.

In one aspect, a phase change memory device comprises a semiconductor substrate having a plurality of phase change cell regions; a lower electrode formed in each of the phase change cell regions on the semiconductor substrate; an insulation layer formed over the semiconductor substrate to cover the lower electrode, the insulation layer having a contact hole which exposes the lower electrode; a heater formed in the contact hole; a conductive pattern formed on the insulation layer except the heater and portions of the insulation layer surrounding the heater; a phase change layer formed on the heater, the conductive pattern, and portions of the insulation layer between the heater and the conductive pattern; and an upper electrode formed on the phase change layer.

The heater is can be formed to completely fill the contact hole or to be recessed on a surface thereof.

The phase change layer and the upper electrode are formed in the shape of a pattern in each phase change cell region or in a manner such that the phase change cell regions are connected with one another.

In another embodiment, a method for manufacturing a phase change memory device comprises the steps of forming a lower electrode in each phase change cell region on a semiconductor substrate; forming an insulation layer over the semiconductor substrate to cover the lower electrode; defining a contact hole by etching the insulation layer to expose the lower electrode; depositing a conductive layer on the insulation layer whereby the contact hole is filled; etching the conductive layer, and thereby forming a heater in the contact hole and a conductive pattern, while exposing the heater and portions of the insulation layer on both sides of the heater; depositing a phase change material layer and a conductive layer for an upper electrode on: the exposed heater, the insulation layer and the conductive pattern; and etching the conductive layer, the phase change material layer, and the conductive pattern, thereby forming a phase change layer and an upper electrode on the heater, the portions of the insulation layer on both sides of the heater, and the conductive pattern.

The conductive layer is deposited through CVD or ALD.

The conductive layer is made of any one of a titanium nitride layer, a titanium tungsten layer, and a titanium aluminum layer.

The heater may be formed to completely fill the contact hole or to be recessed on a surface thereof.

The phase change layer and the upper electrode are formed in the shape of a pattern in each phase change cell region or in a manner such that the phase change cell regions are connected with one another.

DESCRIPTION OF SPECIFIC EMBODIMENTS

Figure 1:
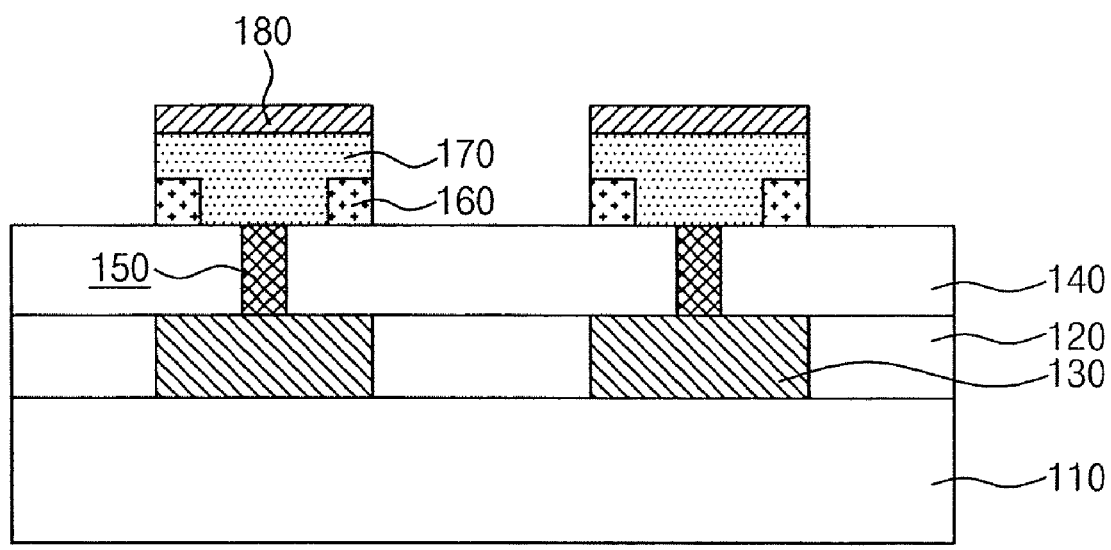
FIG. 1 is a cross-sectional view illustrating a phase change memory device in accordance with an embodiment of the present invention.

FIG. 1 is a cross-sectional view illustrating a phase change memory device in accordance with an embodiment of the present invention.

Referring to FIG. 1, a phase change memory device in accordance with an embodiment of the present invention includes: a semiconductor substrate 110, which has a plurality of phase change cell regions; a lower electrode 130, which is formed in each of the phase change cell regions on the semiconductor substrate 110; an insulation layer 140, which is both formed on the semiconductor substrate 110 to cover the lower electrode 130 and also has a contact hole exposing the lower electrode 130; a heater 150, which is formed in the contact hole; a conductive pattern 160, which is formed on the insulation layer 140 and is spaced apart from the heater 150; a phase change layer 170 which is formed on the heater 150, the conductive pattern 160, and portions of the insulation layer 140 between the heater 150 and the conductive pattern 160; and an upper electrode 180, which is formed on the phase change layer 170.

The unexplained reference numeral 120 designates an oxide layer.

In the present invention; due to the fact that the phase change layer 170 is formed on the heater 150, the conductive pattern 160, and the portions of the insulation layer 140 between the heater 150 and the conductive pattern 160; the phase change layer 170 can be stably formed and is prevented from lifting. That is to say, due to the presence of the conductive pattern 160 formed on the insulation layer 140, the phase change layer 170 is stably formed and is prevented from lifting.

FIGS. 2A through 2E are cross-sectional views illustrating process steps of a method for manufacturing a phase change memory device in accordance with another embodiment of the present invention.

Figure 2A:
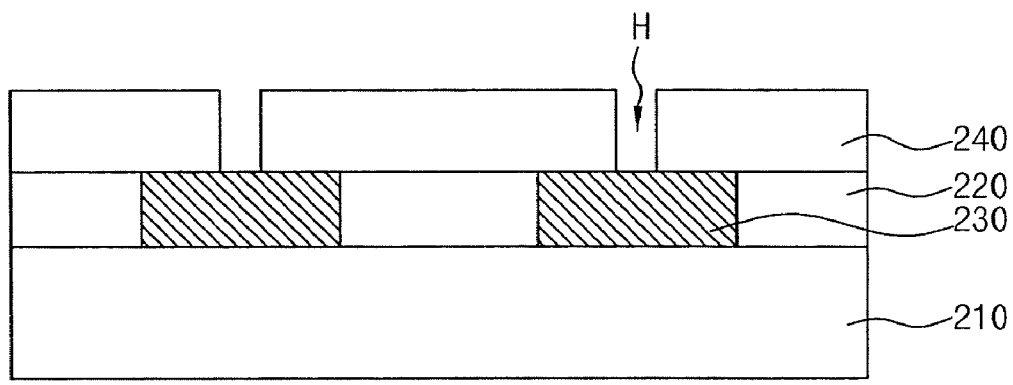
FIGS. 2A through 2E are cross-sectional views illustrating process steps of a method for manufacturing a phase change memory device in accordance with another embodiment of the present invention.

Referring to FIG. 2A, semiconductor substrate 210 has a plurality of phase change cell regions. A lower electrode 230 is formed in each of the phase change cell regions on the semiconductor substrate 210. An insulation layer 240 is deposited on the semiconductor substrate 210 to cover the lower electrode 230. The insulation layer 240 is etched to form a contact hole H exposing the lower electrode 230. The unexplained reference numeral 220 designates an oxide layer.

Figure 2B:
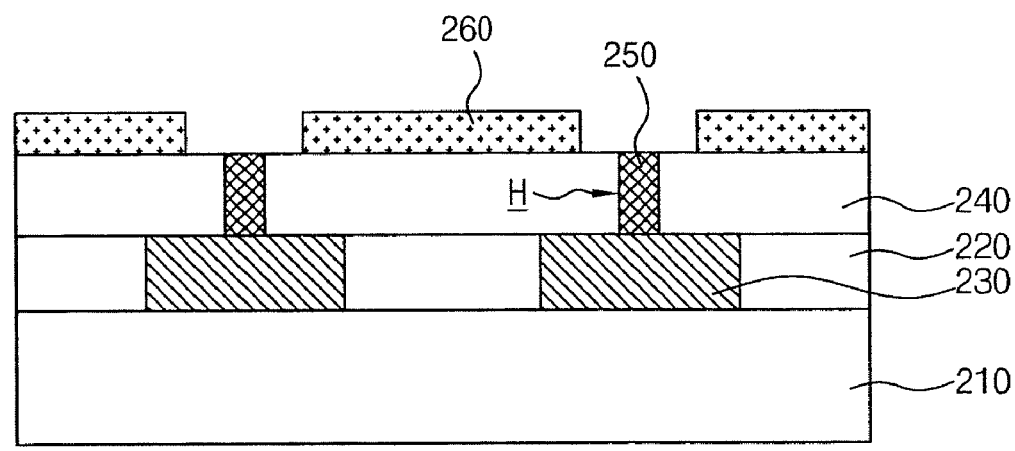

Referring to FIG. 2B, a conductive layer is deposited on the insulation layer 240 in such a way as to fill the contact hole H. The conductive layer is formed through CVD (chemical vapor deposition) or ALD (atomic layer deposition), and is made of any one of a titanium nitride layer (TiN layer), a titanium tungsten layer (TiW layer), and a titanium aluminum layer (TiAl layer). By etching the conductive layer, a heater 250 is formed in the contact hole H and a conductive pattern 260 is formed. The heater 250 and portions of the insulation layer 240 on both sides of the heater 250 are left exposed by the etching process. The heater 250 is formed in such a way as to completely fill the contact hole H.

Figure 2C:
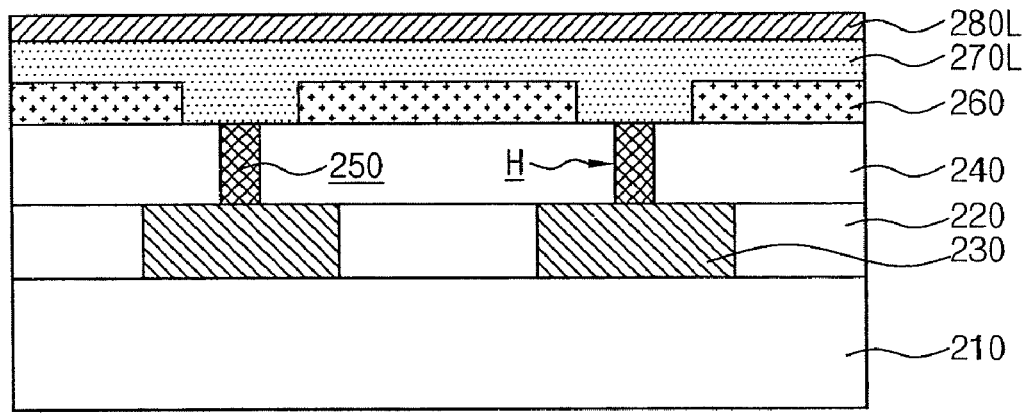

Referring to FIG. 2C, a phase change material layer 270L and a conductive layer 280L for an upper electrode are deposited on the exposed heater 250, the exposed portions of the insulation layer 240, and the conductive pattern 260. In the present invention, when the phase change material layer 270L is depositing, the presence of the conductive pattern 260 allows for stable deposition, and it also prevents a phase change layer from lifting in subsequent processes.

In the conventional art, when the phase change material layer is deposited on the insulation layer, the phase change material layer is likely to be poorly deposited on the insulation layer, and the deposited phase change material layer will likely be lifted during subsequent processes. However, in the present invention, when etching the conductive layer to form the heater in the contact hole, since the conductive pattern is formed on the insulation layer, the phase change material layer can be stably deposited due to the presence of the conductive pattern, and it is possible to prevent the phase change layer from lifting when conducting subsequent processes. Further, because the conductive pattern and the heater are spaced apart when formed, the occurrence of a short circuit is prevented when depositing the phase change material layer.

Figure 2D:
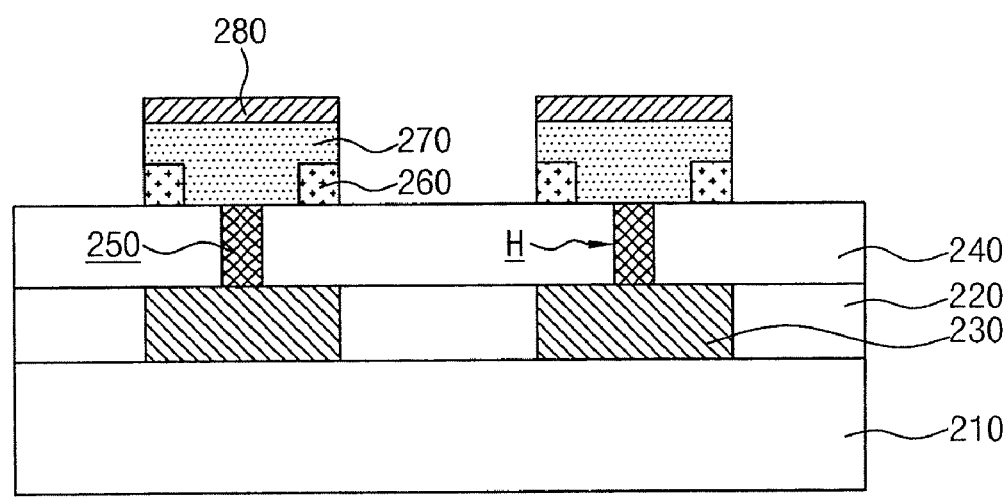

Referring to FIG. 2D, by etching the conductive layer 280L for an upper electrode, the phase change material layer 270L, and the conductive pattern 260; a phase change layer 270 and an upper electrode 280 are formed on: the heater 250, portions of the insulation layer 240 on both sides of the heater 250, and the conductive pattern 260.

Figure 2E:
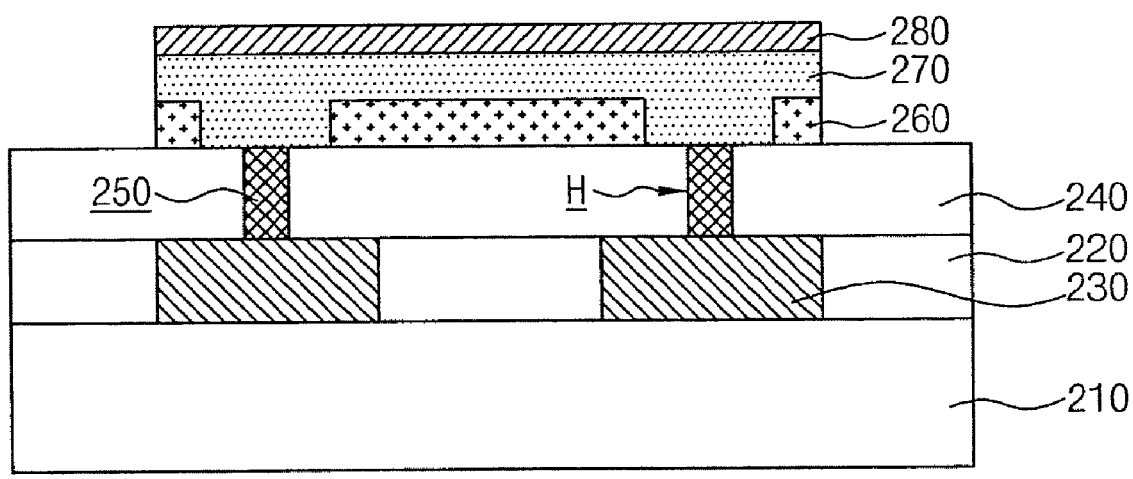

At this time, the phase change layer 270 and the upper electrode 280 can be formed in each phase change cell, or they can be formed in a manner such that the plurality of phase change cells are connected with one another as shown in FIG. 2E.

In the present invention, when the phase change layer and the upper electrode are formed in a manner such that the plurality of phase change cells are connected with one another, it is possible to solve the problem caused by the fact that, as the size of the cell is decreased, and the etched size of the upper electrode and the phase change layer is also decreased, a phase change does not stably occur due to the variation of a composition resulting from the etch loss of the phase change layer on the edge thereof.

FIGS. 3A through 3E are cross-sectional views illustrating process steps of a method for manufacturing a phase change memory device in accordance with yet another embodiment of the present invention.

Figure 3A:
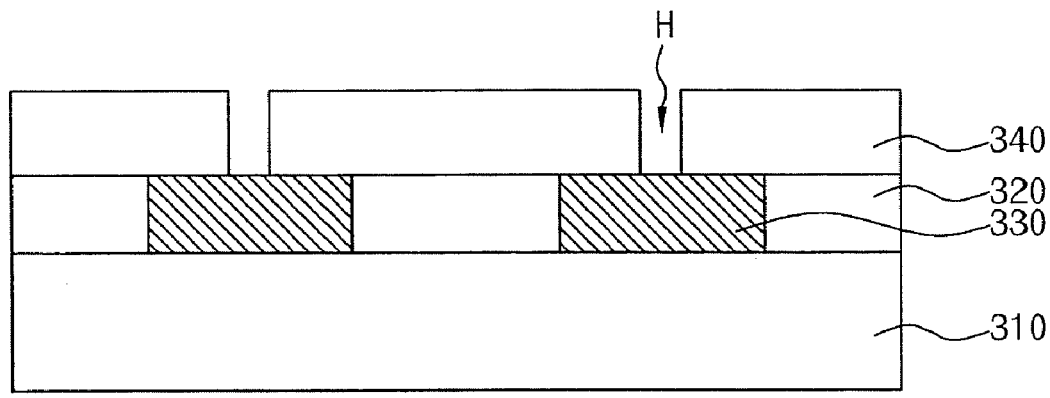
FIGS. 3A through 3E are cross-sectional views illustrating process steps of a method for manufacturing a phase change memory device in accordance with still another embodiment of the present invention.

Referring to FIG. 3A, Semiconductor substrate 310 has a plurality of phase change cell regions. A lower electrode 330 is formed in each of the phase change cell regions on the semiconductor substrate 310. An insulation layer 340 is deposited over the semiconductor substrate 310 to cover the lower electrode 330. By etching the insulation layer 340, a contact hole H exposing the lower electrode 330 is defined. The unexplained reference numeral 320 designates an oxide layer.

Figure 3B:
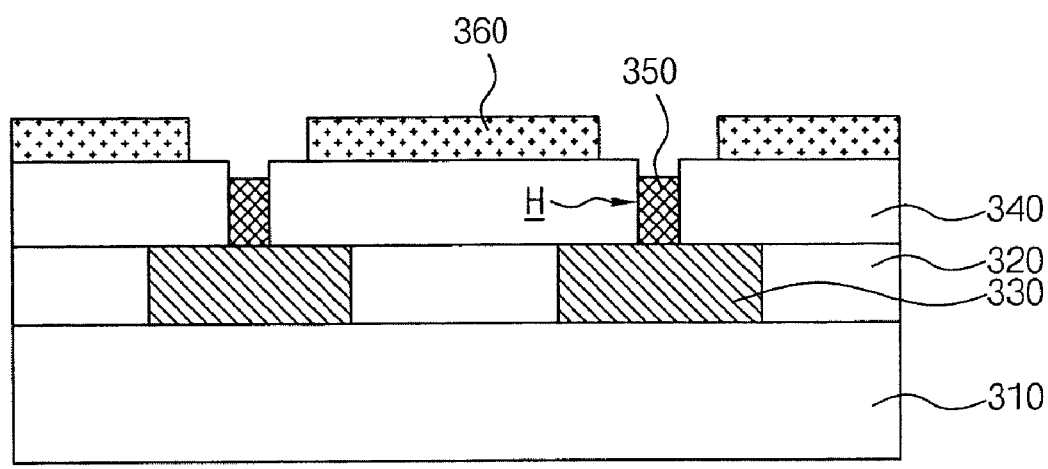

Referring to FIG. 3B, a conductive layer is deposited on the insulation layer 340 filling the contact hole H during the deposition. The conductive layer is formed through CVD (chemical vapor deposition) or ALD (atomic layer deposition), and is made of any one of a titanium nitride layer (TiN layer), a titanium tungsten layer (TiW layer), and a titanium aluminum layer (TiAl layer). By etching the conductive layer, a heater 350 is formed in the contact hole H and a conductive pattern 360 is formed. The heater 350 and portions of the insulation layer 340 on both sides of the heater 350 are left exposed by the etching process. When etching the conductive layer, the heater 350 is formed in such a way as to be recessed to some extent form the surface of the insulation layer.

Figure 3C:
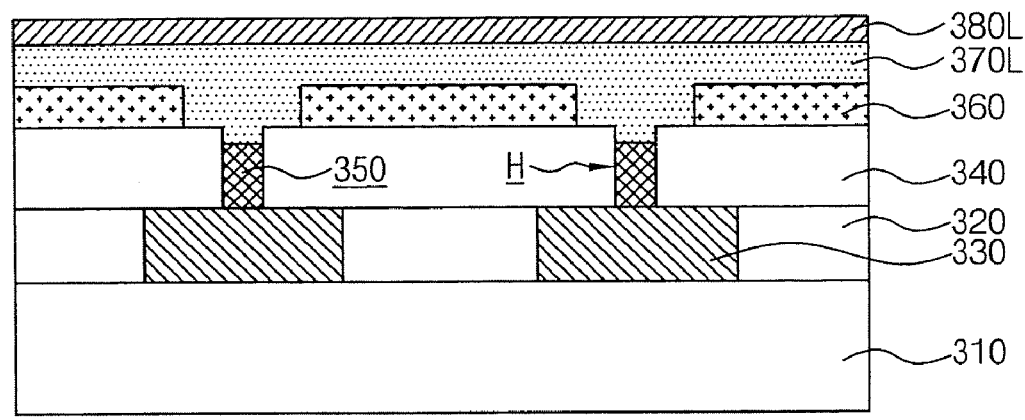

Referring to FIG. 3C, a phase change material layer 370L and a conductive layer 380L for an upper electrode are deposited on the exposed heater 350, the exposed portions of the insulation layer 340, and the conductive pattern 360. In the present invention, the phase change material layer is formed on the exposed recessed heater, and much of the heat is generated in the center portion of the phase change material layer, which has relatively low heat conductivity. It is therefore possible to minimize heat loss, which was typically caused by heat dissipated through the (upper and lower) electrodes made of metallic materials that had relatively high heat conductivity. Therefore, when comparing the present invention to the conventional cell structure, a reset current can be reduced by 50% or more.

Figure 3D:
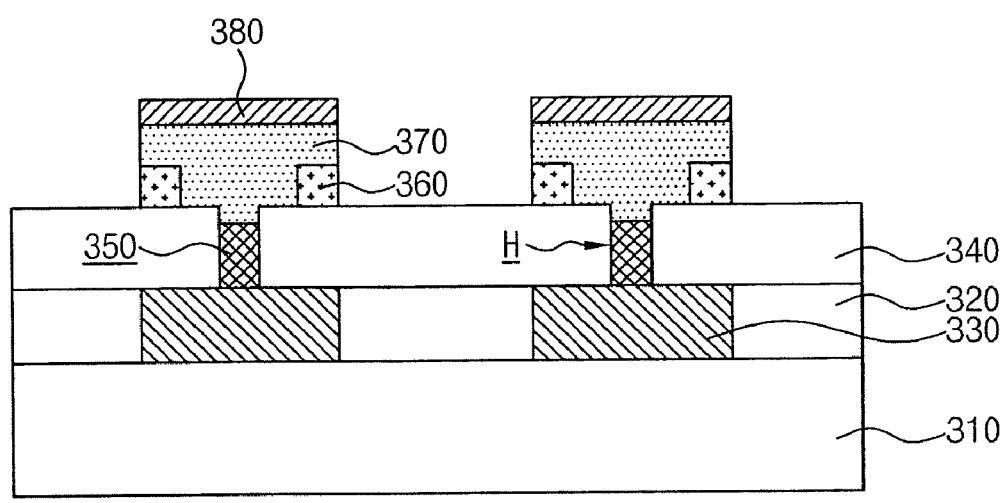

Referring to FIG. 3D, by etching the conductive layer 380L for an upper electrode, the phase change material layer 370L, and the conductive pattern 360, a phase change layer 370 and an upper electrode 380 are formed on: the heater 350, the portions of the insulation layer 340 on both sides of the heater 350, and the conductive pattern 360.

Figure 3E:
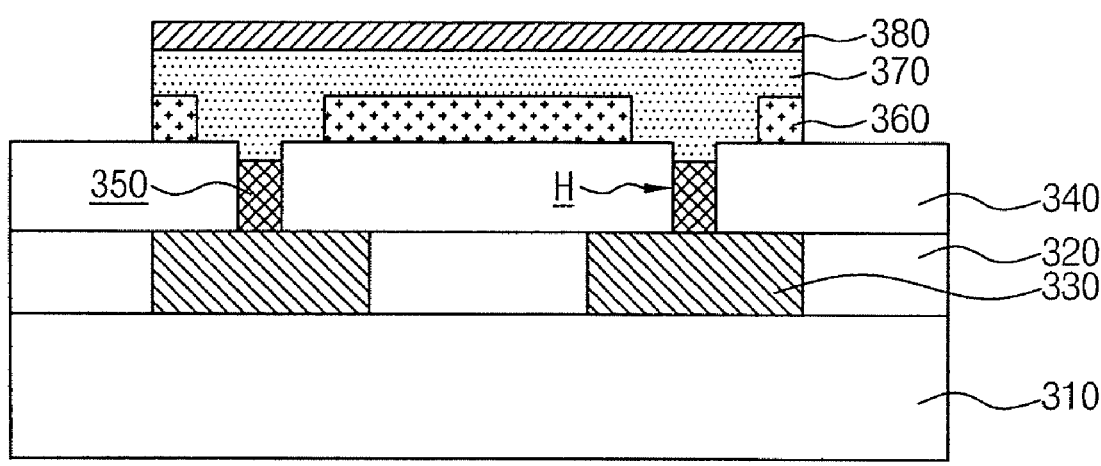

At this time, the phase change layer 370 and the upper electrode 380 can be formed in each phase change cell, or can be formed in a manner such that the plurality of phase change cells are connected with one another as shown in FIG. 3E.

Thereafter, while not shown in the drawings, by sequentially implementing a series of subsequent well-known processes, the manufacture of a phase change memory device according to the present invention is completed.

As is apparent from the above description, in the present invention when forming the heater in a contact hole, by forming a conductive pattern on an insulation layer using the same material as the heater, a phase change material layer can be stably deposited due to the presence of the conductive pattern, and it is possible to prevent a lifting phenomenon from occurring in a phase change layer.

Although a specific embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A phase change memory device comprising:
   a semiconductor substrate having a plurality of phase change cell regions;
   a plurality of lower electrodes formed on the semiconductor substrate in the phase change cell regions;
   an insulation layer formed over the semiconductor substrate and covering the lower electrodes, the insulation layer having a plurality of contact holes exposing the lower electrodes;
   a first heater and a second heater formed in the plurality of contact holes;
   a conductive pattern formed at least on a left side region of the first heater, on a middle region between the first and second heaters, and on a right side region of the second heater so as to expose the first and second heaters, portions of the insulation layer between the first heater and the conductive pattern and portions of the insulation layer between the second heater and the conductive pattern;
   a phase change layer pattern formed on the first and second heaters, the conductive pattern, and the portions of the insulation layer between the first heater and the conductive pattern and between the second heater and the conductive pattern; and
   an upper electrode formed on the phase change layer pattern.

2. The phase change memory device according to claim 1, wherein at least one of the first heater and the second heater is formed to completely fill the contact hole.

3. The phase change memory device according to claim 1, wherein at least one of the first heater and the second heater does not completely fill the contact hole.

4. The phase change memory device according to claim 1, wherein the phase change layer pattern and the upper electrode are formed in the shape of a pattern in each phase change cell region.

5. The phase change memory device according to claim 1, wherein the phase change layer pattern and the upper electrode are formed in a manner such that the phase change layer pattern and the upper electrode extend between and connect phase change cell regions.

6. The phase change memory device according to claim 1, wherein the conductive pattern is made of a same material as the first heater and the second heater.

7. A phase change memory device comprising:
   a semiconductor substrate having a plurality of phase change cell regions;
   a plurality of lower electrodes formed on the semiconductor substrate in the phase change cell regions;
   an insulation layer formed over the semiconductor substrate and covering the lower electrodes, the insulation layer having a plurality of contact holes exposing the lower electrodes;
   a plurality of heaters formed in the plurality of contact holes;
   a conductive pattern formed on portions of the insulation layer on both sides of each heater of the plurality of heaters such that the conductive pattern is formed between adjacent heaters of the plurality of heaters and such that the plurality of heaters and portions of the insulation layer between each heater of the plurality of heaters and the conductive pattern are exposed;
   a phase change layer pattern formed on each heater of the plurality of heaters, the conductive pattern on both sides of each heater of the plurality of heaters, and the portions of the insulation layer between each heater of the plurality of heaters and the conductive pattern; and
   an upper electrode formed on the phase change layer pattern such that for a heater of the plurality of heaters, the phase change layer is interposed between the upper electrode and the conductive pattern on both sides of the heater and is interposed between the upper electrode and the heater between the conductive patterns on both sides of the heater.

* * * * *